United States Patent
Min et al.

(10) Patent No.: US 9,929,309 B2
(45) Date of Patent: Mar. 27, 2018

(54) LIGHT-EMITTING DIODE PACKAGE AND METHOD OF MANUFACTURING THE SAME

(71) Applicant: LIGHTIZER KOREA CO., Seoul (KR)

(72) Inventors: Jae Sik Min, Anyang (KR); Jae Young Jang, Anyang (KR); Jae Yeop Lee, Anyang (KR); Byoung Gu Cho, Anyang (KR)

(73) Assignee: LIGHTIZER KOREA CO., Seoul (KR)

( * ) Notice: Subject to any disclaimer, the term of this patent is extended or adjusted under 35 U.S.C. 154(b) by 0 days.

(21) Appl. No.: 14/609,777

(22) Filed: Jan. 30, 2015

(65) Prior Publication Data

US 2015/0311408 A1     Oct. 29, 2015

(30) Foreign Application Priority Data

Apr. 23, 2014   (KR) .................. 10-2014-0048553

(51) Int. Cl.
*H01L 33/52*   (2010.01)
*H01L 33/00*   (2010.01)
(Continued)

(52) U.S. Cl.
CPC .......... *H01L 33/0095* (2013.01); *H01L 33/44* (2013.01); *H01L 33/505* (2013.01); *H01L 33/52* (2013.01); *H01L 33/62* (2013.01); *H01L 33/507* (2013.01); *H01L 33/641* (2013.01); *H01L 2224/45144* (2013.01);
(Continued)

(58) Field of Classification Search
CPC ..... H01L 33/52; H01L 33/62; H01L 33/0095; H01L 33/641
See application file for complete search history.

(56) References Cited

U.S. PATENT DOCUMENTS

| | | | |
|---|---|---|---|
| 2004/0051111 A1* | 3/2004 | Ota | B82Y 20/00 257/98 |
| 2004/0169181 A1* | 9/2004 | Yoo | H01L 33/44 257/81 |

(Continued)

FOREIGN PATENT DOCUMENTS

| | | |
|---|---|---|
| KR | 1020110051769 | 5/2011 |
| KR | 1020080070193 | 5/2012 |
| KR | 1020120019385 | 12/2012 |

*Primary Examiner* — Ermias Woldegeorgis
(74) *Attorney, Agent, or Firm* — Hunter E. Webb; Keohane & D'Alessandro, PLLC (57) ABSTRACT

Disclosed herein is a light-emitting diode (LED) package in accordance with an embodiment of the present invention, which includes an LED configured to provide light of a wavelength having a specific region, a circuit board electrically connected to the LED through bonding pads formed at the bottom of the LED, a phosphor layer formed as a cap, disposed to surround sides and a top of the LED, and configured to have sides and top thereof formed to a uniform thickness, and a buffer layer disposed between the top of the LED and a bottom of the phosphor layer and configured to suppress heat, generated from the top of the LED, from being transferred to the bottom of the phosphor layer and to prevent a bottom of the phosphor layer from being deviated from the top of the LED.

13 Claims, 8 Drawing Sheets (51) Int. Cl.
*H01L 33/62* (2010.01)
*H01L 33/44* (2010.01)
*H01L 33/50* (2010.01)
*H01L 33/64* (2010.01)

(52) U.S. Cl.
CPC .............. *H01L 2224/48091* (2013.01); *H01L 2224/48227* (2013.01); *H01L 2933/0041* (2013.01)

(56) References Cited

U.S. PATENT DOCUMENTS

| | | | |
|---|---|---|---|
| 2006/0163590 A1* | 7/2006 | Erchak | F21K 9/00 257/88 |
| 2006/0163683 A1* | 7/2006 | Roth | C09K 11/7792 257/432 |
| 2007/0075323 A1* | 4/2007 | Kanazawa | H01L 25/167 257/98 |
| 2008/0048200 A1* | 2/2008 | Mueller | B29C 41/14 257/98 |

* cited by examiner

LIGHT-EMITTING DIODE PACKAGE AND METHOD OF MANUFACTURING THE SAME

CROSS REFERENCE TO RELATED APPLICATION

The present application claims the benefit of Korean Patent Application No. 10-2014-0048553 filed in the Korean Intellectual Property Office on Apr. 23, 2014, the entire contents of which are incorporated herein by reference.

BACKGROUND OF THE INVENTION

1. Technical Field

The present invention relates to a Light-Emitting Diode (LED) package and a method of manufacturing the same and, more particularly, to an LED package and a method of manufacturing the same, wherein a phosphor layer, formed as a cap, is disposed to surround sides and a top of an LED. The phosphor layer is configured to have a thickness of sides and top thereof uniformly formed. A buffer layer coated only on a portion of or an entirety of a top of the LED is disposed between the top of the LED and a bottom of the phosphor layer, thereby being capable of effectively increasing the luminance, view angle, and color uniformity of a light source emitted from the LED and also effectively suppressing the phosphor layer from being deteriorated by heat generated by the LED.

2. Description of the Related Art

Recently, an LED in which aluminum (Al) or indium (In) is added to galliumnitride (GaN) has been in the spotlight due to a long lifespan, low power consumption, excellent brightness, and eco-friendly elements not harmful to the human body as compared with conventional light bulbs. In particular, an LED configured to provide white light has been further in the spotlight.

Such an LED is used in automotive lighting, traffic lights, and the Back Light Unit (BLU) of a liquid crystal display device owing to the aforementioned advantages.

MacAdam Ellipse Rule has recently been suggested as an index for evaluating whether color coordinates measured in an artificial light source are identical with color coordinates when being seen by the human eye. MacAdam's Ellipse Rule provides a 4-step criteria. In the Americas, an artificial light source not complying with three steps of MacAdam's Ellipse Rule is not permitted to be sold. In order to satisfy the three steps of MacAdam's Ellipse Rule, it is very important to reduce a color deviation of white light.

Meanwhile, Korean Patent Application Publication No. 10-2008-0070193 discloses a phosphor film in which a phosphor substance is formed on a surface of a film made of resin. If the phosphor film is attached to an LED, the phosphor film is not effectively attached to a required location of the LED due to electrostatic force or adhesive force between the phosphor substance and the film made of resin. As a result, there are problems in that it is difficult to reduce a color deviation of white light and reliability is low due to poor adhesive force between the LED and the phosphor film.

Furthermore, the phosphor film has many difficulties to apply to a horizontal type LED due to the side light-emission of the LED. Meanwhile, if the side light-emission is shielded in order to solve the side light-emission problem, there are problems in that luminance is reduced due to a loss of the side light-emission, a view angle is reduced, and the color uniformity of a light source is greatly reduced.

SUMMARY OF THE INVENTION

Accordingly, the present invention has been made keeping in mind the above-identified problems occurring in the prior art. An object of the present invention is to provide an LED package and a method of manufacturing the same, wherein a phosphor layer, formed as a cap, is disposed to surround the sides and top of an LED, and configured to have a thickness of sides and a top thereof uniformly formed. A buffer layer is coated only on a portion of or an entirety of the top of the LED, thereby being capable of effectively increasing the luminance, view angle, and color uniformity of a light source emitted from the LED, and also effectively suppressing the phosphor layer from being deteriorated by heat generated by the LED.

Another object of the present invention is to provide a method of manufacturing an LED package, which is capable of easily manufacturing the aforementioned LED package.

Technical objects to be achieved by the present invention are not limited to the aforementioned objects, and other technical objects that have not been described above will become evident to those skilled in the art to which the present invention pertains from the following description.

An LED package in accordance with an embodiment of the present invention includes: an LED configured to provide light of a wavelength having a specific region; a circuit board electrically connected to the LED through bonding pads formed at the bottom of the LED; a phosphor layer formed as a cap, disposed to surround the sides and top of the LED, and configured to have sides and top thereof formed to a uniform thickness; and a buffer layer disposed between the top of the LED and a bottom of the phosphor layer and configured to suppress heat, generated from the top of the LED, from being transferred to the bottom of the phosphor layer and to prevent the bottom of the phosphor layer from being deviated from the top of the LED.

In the LED package in accordance with an embodiment of the present invention, the phosphor layer may be made of a phosphor substance or silicon.

In the LED package in accordance with an embodiment of the present invention, the buffer layer may include at least one of transparent silicon, transparent epoxy, transparent organic polymer, and transparent glass resin.

In the LED package in accordance with an embodiment of the present invention, the buffer layer may have a thickness of 5 μm to 150 μm.

An LED package in accordance with another embodiment of the present invention includes: an LED configured to provide light of a wavelength having a specific region and to have bonding pads formed on a top of the LED; a circuit board disposed under the LED and electrically connected to the LED through the bonding pads; a phosphor layer formed as a cap, disposed to surround sides and the top of the LED, and configured to have sides and a top thereof formed to a uniform thickness, wherein if the phosphor layer is disposed to surround the sides and top of the LED, bonding holes are formed at the top of the phosphor layer so that the bonding pads of the LED are exposed; and a buffer layer disposed in regions other than regions in which the bonding pads between the top of the LED and a bottom of the phosphor layer have been formed and configured to suppress heat, generated from the top of the LED, from being transferred to the bottom of the phosphor layer and to prevent the bottom of the phosphor layer from being deviated from the top of the LED.

In the LED package in accordance with an embodiment of the present invention, the phosphor layer may be made of a phosphor substance or silicon.

In the LED package in accordance with an embodiment of the present invention, the buffer layer may include at least one of transparent silicon, transparent epoxy, transparent organic polymer, and transparent glass resin.

In the LED package in accordance with an embodiment of the present invention, the buffer layer may have a thickness of 5 μm to 150 μm.

A method of manufacturing an LED package in accordance with an embodiment of the present invention includes: mounting, on a circuit board, an LED configured to provide light of a wavelength having a specific region and to have bonding pads formed at the bottom of the LED; coating, on a top of the LED, a buffer layer configured to suppress heat, generated from the top of the LED, from being transferred upwardly and to prevent elements to be attached from being deviated from the top of the LED; and disposing a phosphor layer formed as a cap and configured to have sides and a top thereof formed to a uniform thickness so that the phosphor layer surrounds sides and the top of the LED, and attaching the phosphor layer to the top of the buffer layer.

In the method in accordance with an embodiment of the present invention, the phosphor layer may be made of a phosphor substance or silicon.

In the method in accordance with an embodiment of the present invention, the buffer layer may include at least one of transparent silicon, transparent epoxy, transparent organic polymer, and transparent glass resin.

In the method in accordance with an embodiment of the present invention, the buffer layer may have a thickness of 5 μm to 150 μm.

A method of manufacturing an LED package in accordance with another embodiment of the present invention includes: mounting, on a circuit board, an LED configured to provide light of a wavelength having a specific region and to have bonding pads formed on top of the LED; coating, on regions on a top of the LED other than regions in which the bonding pads have been formed, a buffer layer configured to suppress heat, generated from the top of the LED, from being transferred upwardly and to prevent elements to be attached from being deviated from the top of the LED; and disposing a phosphor layer formed as a cap so that the phosphor layer surrounds sides and the top of the LED and configured to have sides and a top thereof formed to a uniform thickness and to have bonding holes formed on top of the phosphor layer so that the bonding pads of the LED are exposed, and attaching the phosphor layer to a top of the buffer layer.

In the method in accordance with an embodiment of the present invention, the phosphor layer may be made of a phosphor substance or silicon.

In the method in accordance with an embodiment of the present invention, the buffer layer may include at least one of transparent silicon, transparent epoxy, transparent organic polymer, and transparent glass resin.

In the method in accordance with an embodiment of the present invention, the buffer layer may have a thickness of 5 μm to 150 μm.

BRIEF DESCRIPTION OF THE DRAWINGS

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines, which would otherwise be visible in a "true" cross-sectional view, for illustrative clarity. Furthermore, for clarity, some reference numbers may be omitted in certain drawings.

Hereinafter, exemplary embodiments of the present invention are described in detail with reference to the accompanying drawings.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, are interchangeable and specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," "some embodiments," or similar language means that a particular feature, structure, or characteristic described in connection with the embodiment is included in at least one embodiment of the present invention. Thus, appearances of the phrases "in one embodiment," "in an embodiment," "in embodiments", "in some embodiments," and similar language throughout this specification may, but do not necessarily, all refer to the same embodiment. It will be understood that one skilled in the art may cross embodiments by "mixing and matching" one or more features of one embodiment with one or more features of another embodiment.

Figure 1:
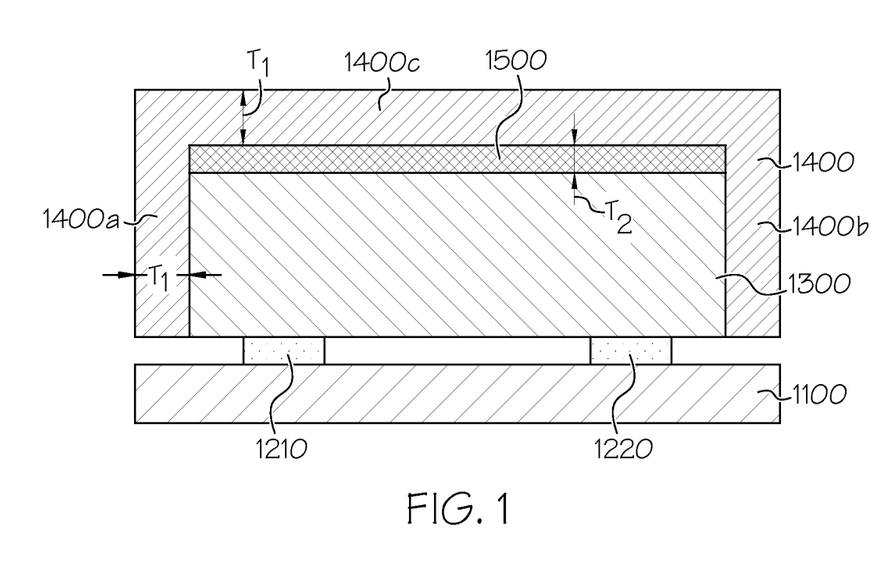
FIG. 1 is a cross-sectional view showing an LED package in accordance with an embodiment of the present invention.

An LED package in accordance with an embodiment of the present invention may be configured to include a light-emitting diode (LED) 1300, a circuit board 1100, a phosphor layer 1400, and a buffer layer 1500, as shown in FIG. 1.

The LED 1300 provides light of a wavelength having a specific region. More specifically, the LED 1300 may be an LED that provides light of, for example, a blue wavelength or an LED that provides light of an ultraviolet wavelength.

Bonding pads 1210 and 1220 made of metal are electrically connected to the circuit board 1100 and are disposed at the bottom of the LED 1300. Non-limiting examples of suitable metals include copper (Cu), aluminum (Al), gold (Au) and silver (Ag). The circuit board 1100 is disposed under the LED 1300.

The phosphor layer 1400, formed as a cap, is disposed to surround the side surfaces and top surface of the LED 1300. The sides 1400a and 1400b and top 1400c of the phosphor layer 1400 have a uniform thickness T1. It should be recognized that the view shown is a cross-section, so the LED 1300 has a side in front and behind (not shown), which are also covered by a third and fourth side of phosphor layer 1400. Typically, the LED 1300 therefore, has four (4) sides, each surrounded by a respective side of the phosphor layer. In other embodiments, the LED 1300 may have more or fewer than 4 sides, and the phosphor layer 2300 will have a corresponding number of sides as well. In embodiments, T1 may be approximately 30 μm to 300 μm.

The phosphor layer 1400 functions to convert light, provided by the LED 1300, into white light by changing the wavelength of light emitted from the sides or top of the LED 1300. The phosphor layer 1400 may be made of a phosphor (material/substance) or silicon.

The buffer layer 1500 is disposed between the top surface of the LED 1300 and the bottom surface of the top of the phosphor layer 1400 (i.e. the underside of the top of the phosphor layer 1400). The buffer layer 1500 functions to suppress heat, generated from the top of the LED 1300, from being transferred to the bottom surface of the top of the phosphor layer 1400. The buffer layer 1500 also functions to prevent the bottom surface of the top of the phosphor layer 1400 from being deviated from the top surface of the LED 1300.

In this case, the buffer layer 1500 may be coated only on a portion of, or an entirety of, the top of the LED 1300 and then attached to the phosphor layer 1400.

Furthermore, the buffer layer 1500 is formed to include one or more of transparent silicon, transparent epoxy, transparent organic polymer, and transparent glass resin. The buffer layer 1500 is formed in thickness of T2, which in some embodiment may be approximately 5 μm to 150 μm.

Figure 2:
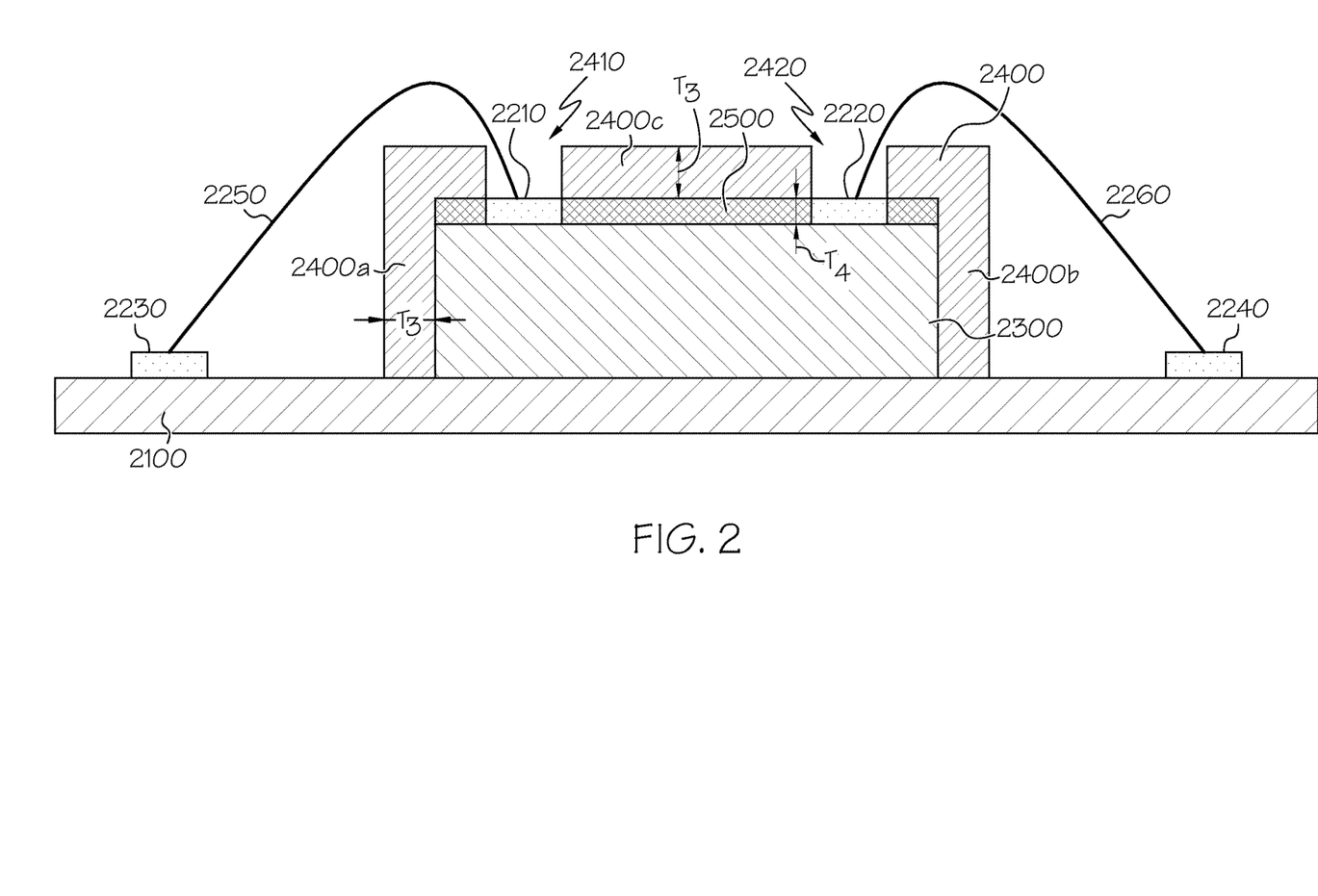
FIG. 2 is a cross-sectional view showing an LED package in accordance with another embodiment of the present invention.

An LED package in accordance with another embodiment of the present invention may be configured to include an LED 2300, a circuit board 2100, a phosphor layer 2400, and a buffer layer 2500, as shown in FIG. 2.

The LED 2300 provides light of a wavelength having a specific region. More specifically, the LED 2300 may be, for example, an LED that provides light of a blue wavelength or an LED that provides light of a ultraviolet wavelength.

Bonding pads 2210 and 2220 made of metal are electrically connected to the circuit board 2100 and are disposed on top of the LED 2300. Non-limiting examples of suitable metals include copper (Cu), aluminum (Al), gold (Au), and silver (Ag). The circuit board 2100 is disposed under the LED 2300. The circuit board 2100 is connected to the bonding pads 2210 and 2220 by printed circuit board (PCB) pads 2230 and 2240, via wires 2250 and 2260. PCB pads 2230 and 2240 are made of metal, non-limiting examples of which include copper (Cu), aluminum (Al), gold (Au) and silver (Ag). In some embodiments, wire 2250 and 2260 are gold wires.

The phosphor layer 2400 is formed as a cap and is disposed to surround the sides and top of the LED 2300. The sides 2400a and 2400b and top of the phosphor layer 2400 have a uniform thickness T3, which in some embodiments may be approximately 30 μm to 300 μm.

It should be recognized that the view shown is a cross-section, so the LED 2300 has a side in front and behind (not shown), which are also covered by a third and fourth side of phosphor layer 2400. Typically, the LED 2300 has four (4) sides, each surrounded by a respective side of the phosphor layer. In other embodiments, the LED 2300 may have more or fewer than 4 sides, and the phosphor layer 2400 will have a corresponding number of sides as well. The phosphor layer 2400 functions to convert light, provided by the LED 2300, into white light by changing the wavelength of light emitted from the sides or top of the LED 2300. The phosphor layer 2400 may be made of a phosphor (substance) or silicon.

If the phosphor layer 2400 is disposed to surround the side s and top of the LED 2300 as described above, bonding holes 2410 and 2420 are formed at the top of the phosphor layer 2400 so that the bonding pads 2210 and 2220 of the LED 2300 are exposed, as shown in FIG. 2.

Meanwhile, the buffer layer 2500 is disposed in regions other than the regions in which the bonding pads 2210 and 2220 between the top of the LED 2300 and the bottom surface (underside) of the top of phosphor layer 2400 are formed. The buffer layer 2500 functions to suppress heat, generated from the top of the LED 2300, from being transferred to the bottom surface of the top of phosphor layer 2400 and also to prevent the bottom surface of the top phosphor layer 2400 from being deviated from the top of the LED 2300.

In this case, the buffer layer 2500 may be coated only on a portion of, or an entirety of, the top of the LED 2300 and then attached to the phosphor layer 2400.

Furthermore, the buffer layer 2500 is formed to include one or more of transparent silicon, transparent epoxy, transparent organic polymer, and transparent glass resin. The buffer layer 2500 is formed in thickness of T4, which in some embodiments is approximately 5 μm to 150 μm.

The phosphor layer 1400, 2400 adopted in the LED packages in accordance with the embodiments of the present invention is formed as a cap. The phosphor layer 1400, 2400 is disposed to surround the sides and top of the LED 1300, 2300, and configured to have a uniform thickness of the sides and top thereof. Accordingly, the luminance and view angle of a light source emitted from the LED 1300, 2300 can be increased, and the color uniformity of the light source can also be effectively increased.

Furthermore, in the LED packages in accordance with the embodiments of the present invention, the phosphor layer 1400, 2400 is attached to the buffer layer 1500, 2500 coated only on a portion of, or an entirety of, the top of the LED 1300, 2300. Accordingly, the phosphor layer 1400, 2400 can be effectively suppressed from being deteriorated by heat generated by the LED.

A method of manufacturing the LED package in accordance with an embodiment of the present invention is described below with reference to FIGS. 3A to 3C.

Figure 3A:
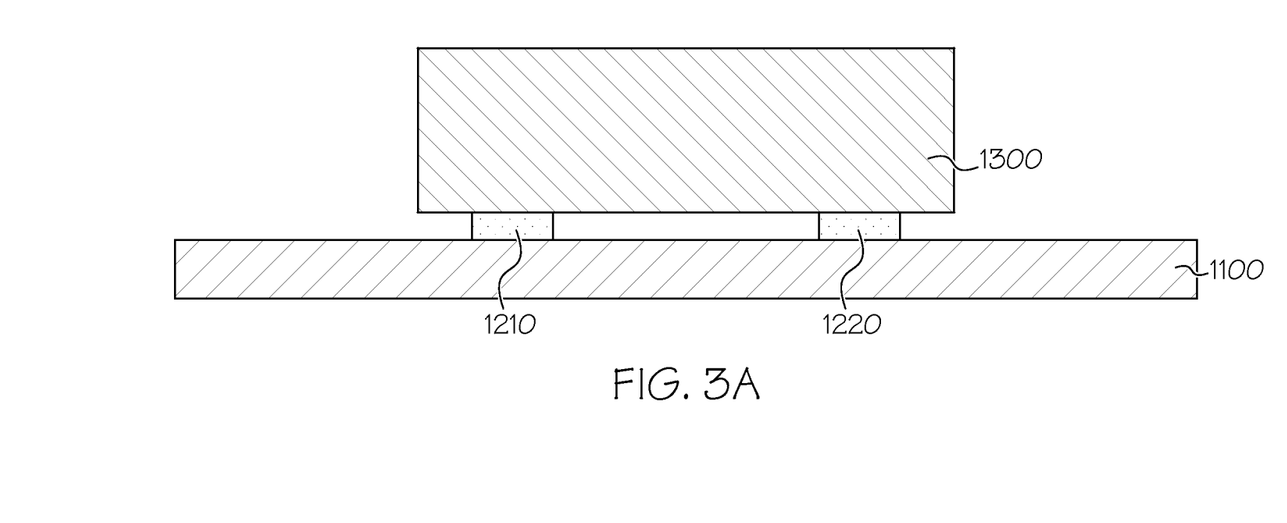
FIGS. 3A to 3C are cross-sectional views showing processes of making the LED package shown in FIG. 1.

First, as shown in FIG. 3A, the LED 1300 is mounted on the circuit board 1100. In this case, the LED 1300 provides light of a wavelength having a specific region, and the bonding pads 1210 and 1220 are formed under the LED 1300 (between LED 1300 and circuit board 1100).

Figure 3B:
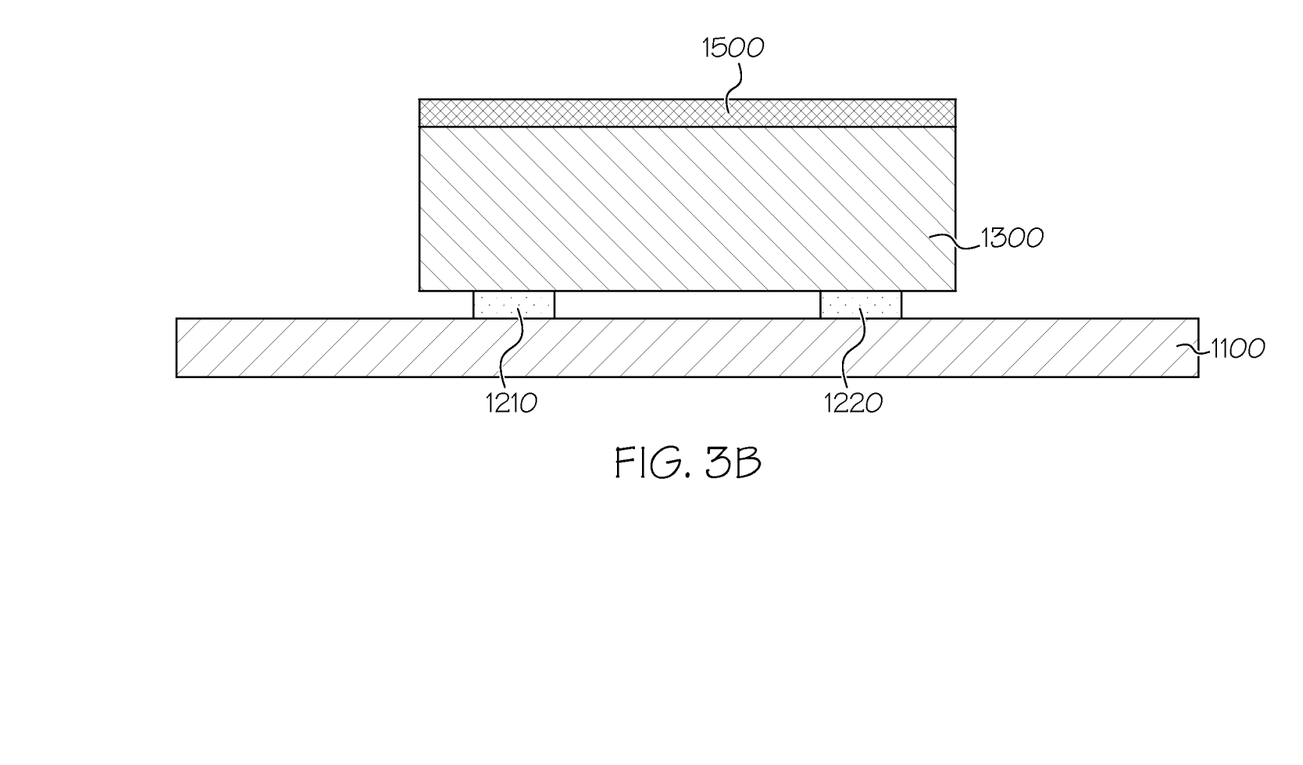

Thereafter, as shown in FIG. 3B, the buffer layer 1500 is coated on the top of the LED 1300. In this case, the buffer layer 1500 functions to suppress heat, generated from the top of the LED 1300, from being transferred upwardly. The buffer layer 1500 also functions to prevent particles or contaminants to be attached to the top of the LED 1300 from being deviated.

Figure 3C:
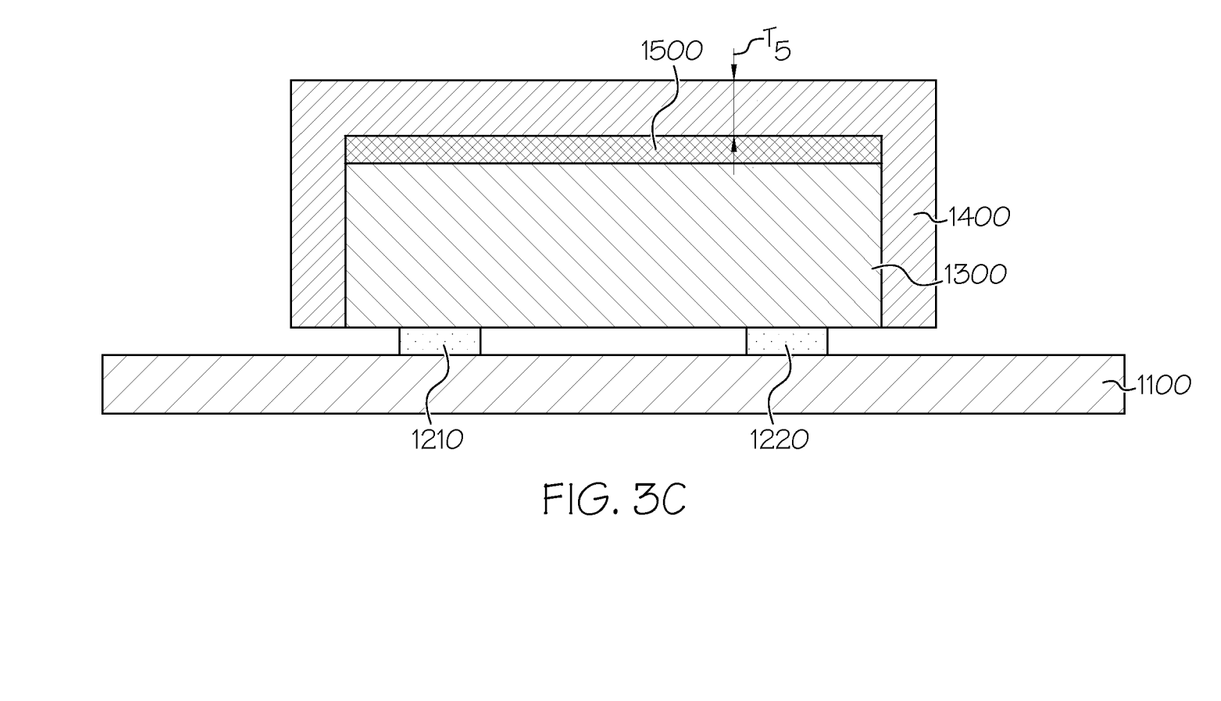

Thereafter, as shown in FIG. 3C, the phosphor layer 1400 is disposed to surround the sides and top of the LED 1300 and is then attached to the top surface of the buffer layer 1500. Typically, the LED 1300 has four (4) sides, each surrounded by a respective side of the phosphor layer. In other embodiments, the LED 1300 may have more or fewer than 4 sides, and the phosphor layer 2300 will have a corresponding number of sides as well. In this case, the phosphor layer 1400 is formed as a cap over the LED 1300 and buffer layer 1500. The sides and top of the phosphor layer 1400 are formed to have a uniform thickness T5, which in some embodiments may be approximately 30 μm to 300 μm.

A method of manufacturing the LED package in accordance with another embodiment of the present invention is described below with reference to FIGS. 4A to 4C.

Figure 4A:
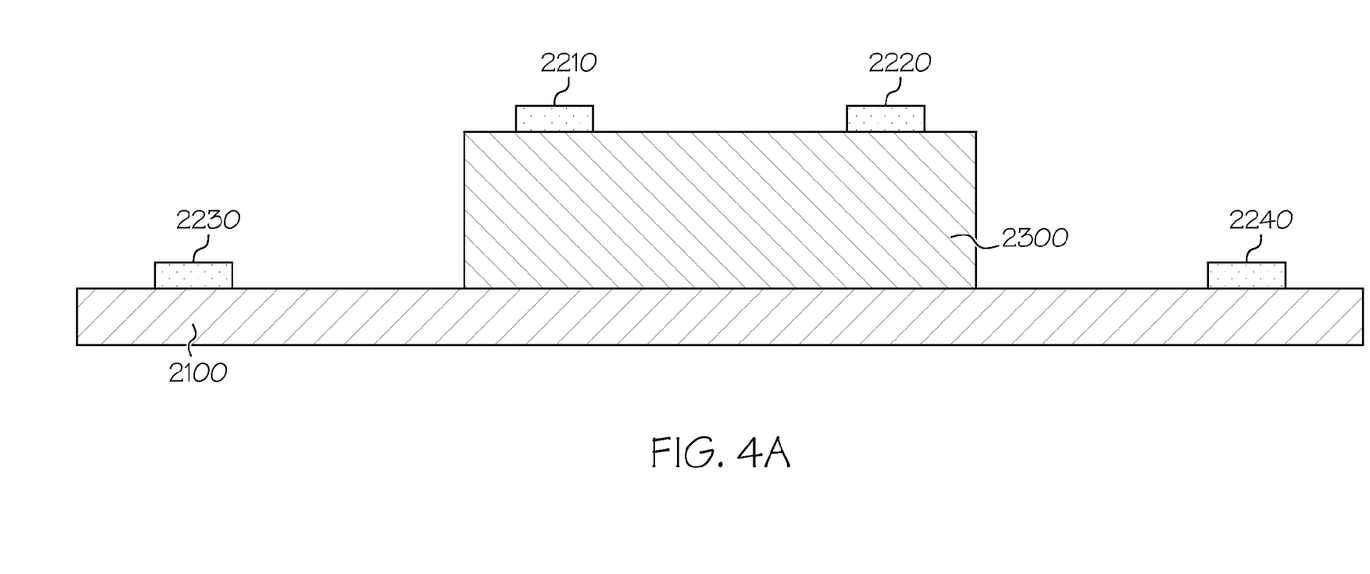
FIGS. 4A to 4C are cross-sectional views showing processes of making the LED package shown in FIG. 2.

First, as shown in FIG. 4A, the LED 2300 is mounted on the circuit board 2100. In this case, the LED 2300 provides light of a wavelength having a specific region, and the bonding pads 2210 and 2220 are formed at the top of the LED 2300. PCB pads 2230 and 2240 are formed on circuit board 2100.

Figure 4B:
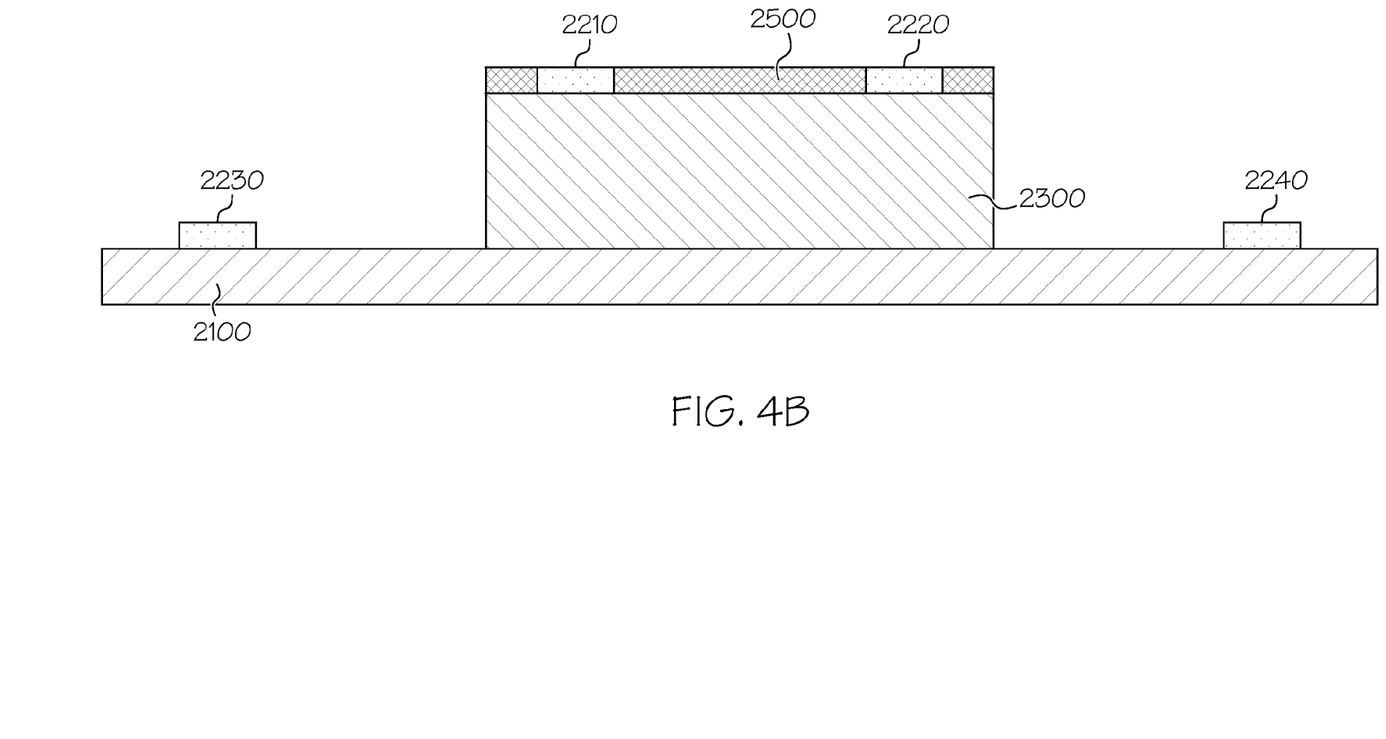

Thereafter, as shown in FIG. 4B, the buffer layer 2500 is coated on regions of the top of the LED 2300 other than the regions in which the bonding pads 2210 and 2220 have been formed. In this case, the buffer layer 2500 functions to suppress heat generated from the top of the LED 2300, from being transferred upwardly. The buffer layer 2500 also functions to prevent elements to be attached to the top of the LED 2300 from being deviated.

Figure 4C:
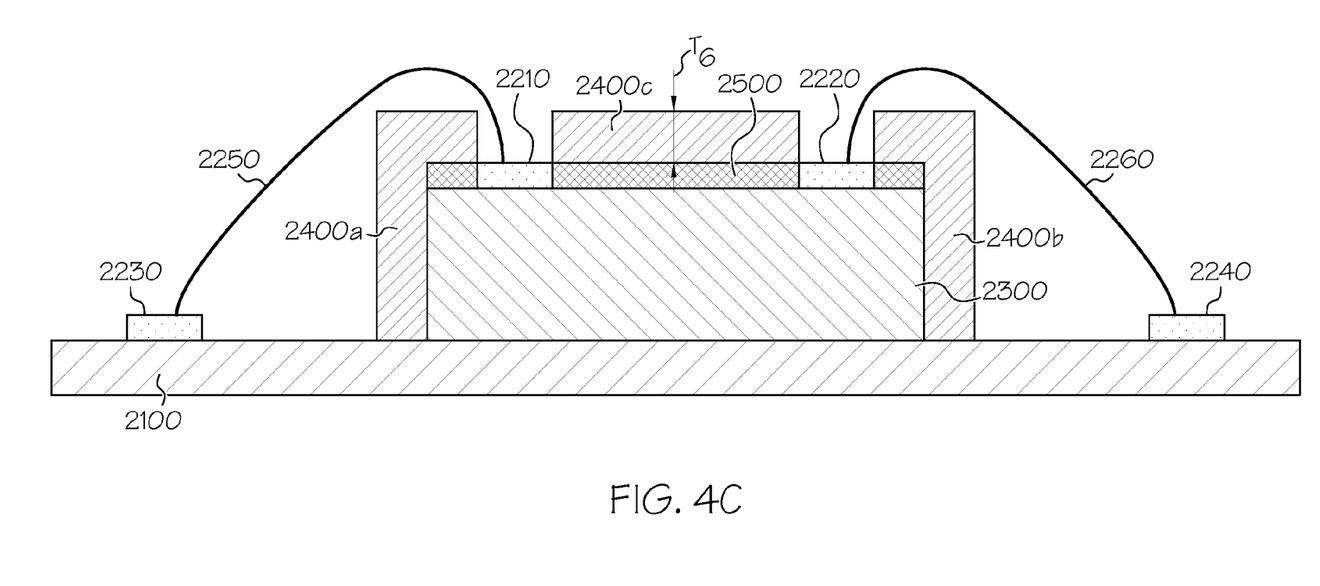

Thereafter, as shown in FIG. 4C, the phosphor layer 2400 is disposed to surround the side surfaces and top surface of the LED 2300 and is then attached to the top of the buffer layer 2500. In this case, the phosphor layer 2400 is formed as a cap. The sides and top of the phosphor layer 2400 are formed to have a uniform thickness, T6, which in some embodiments may be approximately 30 μm to 300 μm.

Typically, the LED 2300 has four (4) sides, each surrounded by a respective side of the phosphor layer. In other embodiments, the LED 2300 may have more or fewer than 4 sides, and the phosphor layer 2400 will have a corresponding number of sides as well. The bonding holes 2410 and 2420 are formed at the top of the phosphor layer 2400 so that the bonding pads 2210 and 2220 of the LED 2300 are exposed. A wire 2250 is run between bonding pad 2210 and PCB pad 2230, and another wire 2260 is run between bonding pad 2220 and PCB pad 2240. In some embodiments, wire 2250 and 2260 are gold wires.

In the LED packages in accordance with the embodiments of the present invention, the phosphor layer disposed to surround the sides and top of the LED like a cap, and configured to have the thickness of sides and top thereof uniformly formed is attached to the buffer layer coated only on part of or an entirety of the top of the LED. Accordingly, the luminance, view angle, and color uniformity of a light source emitted from the LED can be effectively increased, and the phosphor layer can also be effectively suppressed from being deteriorated by heat generated by the LED.

Furthermore, in the methods of manufacturing the LED package in accordance with the embodiments of the present invention, since the phosphor layer is attached to the buffer layer coated only on a portion of or an entirety of the top of the LED. Accordingly, process steps can be effectively reduced, and a process yield can also be effectively improved.

The exemplary embodiments of the present invention have been described in order to illustrate the principle of the present invention, but the present invention is not limited to the aforementioned constructions and operations.

Those skilled in the art will appreciate that the present invention may be changed and modified in various ways without departing from the spirit and scope of the present invention.

Accordingly, all proper changes and modifications and equivalents thereof should be construed as belonging to the scope of the present invention.

What is claimed is:

1. A Light-Emitting Diode (LED) package, comprising:
    an LED configured to provide light of a wavelength having a specific region;
    a circuit board electrically connected to the LED through bonding pads formed at a bottom of the LED;
    a phosphor layer formed as a cap, disposed to surround sides and a top of the LED, and configured to have sides and top thereof formed to a uniform thickness of 30 μm to 300 μm such that a luminance and a view angle of light source emitted from the sides and the top of the LED is maximized and a color uniformity of the light source from the sides and the top of the LED is maximized; and
    a buffer layer having a thickness of 5 μm to 150 μm disposed directly between the top of the LED and a bottom of the top of the phosphor layer such that the top of the phosphor layer is separated from the top of the LED by the buffer layer and the sides of the phosphor layer are directly adjacent to the LED, the buffer layer not being disposed to any side of the LED, wherein the buffer layer is configured to suppress heat, generated from the top of the LED, from being transferred to a bottom of the phosphor layer and to prevent the bottom of the phosphor layer from being deviated from the top of the LED.

2. The LED package of claim 1, wherein the phosphor layer is made of a phosphor substance or silicon.

3. The LED package of claim 1, wherein the buffer layer comprises at least one of transparent silicon, transparent epoxy, transparent organic polymer, and transparent glass resin.

4. A Light-Emitting Diode (LED) package, comprising:
    an LED configured to provide light of a wavelength having a specific region;
    a plurality of bonding pads formed on a top of the LED;
    a circuit board disposed under the LED and electrically connected to the LED through the plurality of bonding pads;
    a phosphor layer formed as a cap, disposed to surround sides and a top of the LED, and configured to have the sides and the top thereof formed to a uniform thickness of 30 μm to 300 μm, wherein if the phosphor layer is disposed to surround the sides and the top of the LED such that a luminance and a view angle of light source emitted from the sides and the top of the LED is maximized and a color uniformity of the light source from the sides and the top of the LED is maximized, wherein bonding holes are formed at the top of the phosphor layer so that the plurality of bonding pads are exposed; and a buffer layer having a thickness of 5 μm to 150 μm disposed in regions other than regions in which the plurality of bonding pads directly between the top of the LED and a bottom of the phosphor layer have been formed such that the top of the phosphor layer is separated from the top of the LED by the buffer layer and the sides of the phosphor layer are directly adjacent to the LED, the buffer layer not being disposed to any side of the LED, wherein the buffer layer is configured to suppress heat, generated from the top of the LED, from being transferred to the bottom of the phosphor layer and to prevent the bottom of the phosphor layer from being deviated from the top of the LED.

5. The LED package of claim 4, wherein the phosphor layer is made of a phosphor substance or silicon.

6. The LED package of claim 4, wherein the buffer layer comprises at least one of transparent silicon, transparent epoxy, transparent organic polymer, and transparent glass resin.

7. A method of manufacturing a Light-Emitting Diode (LED) package, comprising:
  mounting, on a circuit board, an LED configured to provide light of a wavelength having a specific region and to have bonding pads formed at a bottom of the LED;
  coating, on a top of the LED, a buffer layer having a thickness of 5 μm to 150 μm configured to suppress heat, generated from the top of the LED, from being transferred upwardly and to prevent elements to be attached from being deviated from the top of the LED, the buffer layer not being coated disposed to any side of the LED; and
  disposing a phosphor layer formed as a cap and configured to have sides and a top thereof formed to a uniform thickness of 30 μm to 300 μm so that the phosphor layer surrounds the sides and the top of the LED such that a luminance and a view angle of light source emitted from the sides and the top of the LED is maximized and a color uniformity of the light source from the sides and the top of the LED is maximized, and attaching the phosphor layer directly to a top of the buffer layer such that the top of the phosphor layer is separated from the top of the LED by the buffer layer and the sides of the phosphor layer are directly adjacent to the LED.

8. The method of claim 7, wherein the phosphor layer is made of a phosphor substance or silicon.

9. The method of claim 7, wherein the buffer layer comprises at least one of transparent silicon, transparent epoxy, transparent organic polymer, and transparent glass resin.

10. A method of manufacturing a Light-Emitting Diode (LED) package, comprising:
  mounting, on a circuit board, an LED configured to provide light of a wavelength having a specific region, wherein the LED has bonding pads formed on a top of the LED;
  coating, on regions on the top of the LED other than regions in which the bonding pads have been formed, a buffer layer having a thickness of 5 μm to 150 μm such that the top of the phosphor layer is separated from the top of the LED by the buffer layer and the sides of the phosphor layer are directly adjacent to the LED, wherein the buffer layer is configured to suppress heat, generated from the top of the LED, from being transferred upwardly and to prevent elements to be attached from being deviated from the top of the LED, the buffer layer not being coated disposed to any side of the LED; and
  disposing a phosphor layer formed as a cap so that the phosphor layer surrounds sides and the top of the LED and configured to have sides and a top thereof formed to a uniform thickness of 30 μm to 300 μm such that a luminance and a view angle of light source emitted from the sides and the tot of the LED is maximized and a color uniformity of the light source from the sides and the top of the LED is maximized and to have bonding holes formed on the top of the phosphor layer so that the bonding pads of the LED are exposed, and attaching the phosphor layer directly to a top of the buffer layer.

11. The method of claim 10, wherein the phosphor layer is made of a phosphor substance or silicon.

12. The method of claim 10, wherein the buffer layer comprises at least one of transparent silicon, transparent epoxy, transparent organic polymer, and transparent glass resin.

13. The method of claim 12, wherein the buffer layer has a thickness of 5 μm to 150 μm.

* * * * *